United States Patent [19]

Pileri

[11] 4,423,380

[45] Dec. 27, 1983

[54] METHOD OF TESTING A MEMORY BY SCANNING AT INCREASING TIME INTERVALS

[75] Inventor: Douglas C. Pileri, Tonawanda, N.Y.

[73] Assignee: Burroughs Corporation, Detroit, Mich.

[21] Appl. No.: 181,471

[22] Filed: Aug. 26, 1980

[51] Int. Cl.$^3$ ................. G01R 33/12; G01R 15/12
[52] U.S. Cl. ........................... 324/73 R; 324/210; 365/201; 371/21
[58] Field of Search ........................... 324/210-212, 324/73 R; 365/201; 371/21; 328/59

[56] References Cited

U.S. PATENT DOCUMENTS 3,870,963  3/1975  Groce et al. ................. 328/59

OTHER PUBLICATIONS

Anolick et al., "Memory Test System", Dec. 1979, IBM Tech. Disclosure Bulletin, vol. 22, No. 7, pp. 2837–2838.

*Primary Examiner*—Gerard R. Strecker
*Assistant Examiner*—Walter E. Snow
*Attorney, Agent, or Firm*—Kevin R. Peterson; Robert A. Green; David G. Rasmussen

[57] ABSTRACT

The disclosure is of a method and system for scanning all of the cells of a dynamic memory at selected increasing time intervals. The apparatus includes first and second counters coupled to a comparator, the output of which triggers the operation of the scanning apparatus. When the system is turned on, the count in both counters is the same, and a signal appears at the output of the comparator to trigger the scanner. If no error appears in the memory, the first counter is incremented by a selected first count, and then the second counter is incremented from zero until its count equals that in the first counter, and, again, an output from the comparator triggers the scanner. Again, if no error appears in the memory, the first counter is incremented by a second greater count, which represents a larger time interval, and the second counter is incremented from zero until its count equals that entered in the first counter, and the comparator again energizes the scanner. This operation is repeated with progressively higher counts in the first counter, representing larger and larger time intervals, until an error appears in the memory.

1 Claim, 3 Drawing Figures

Fig. 1
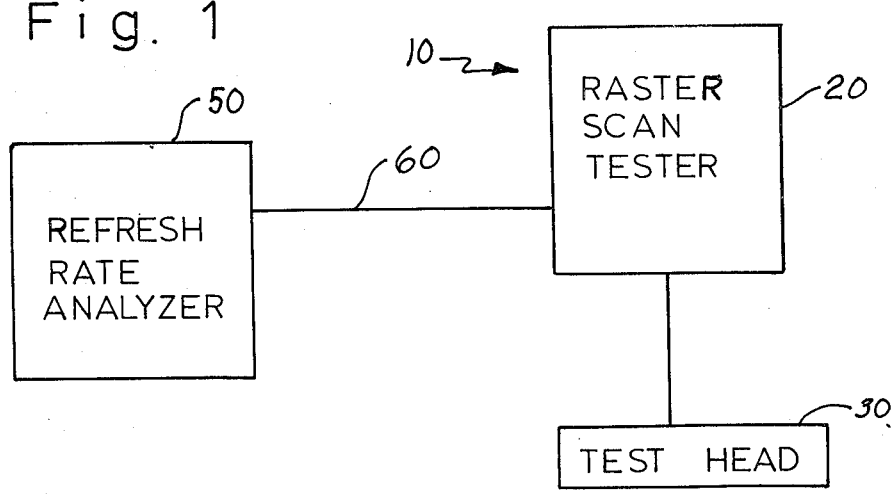
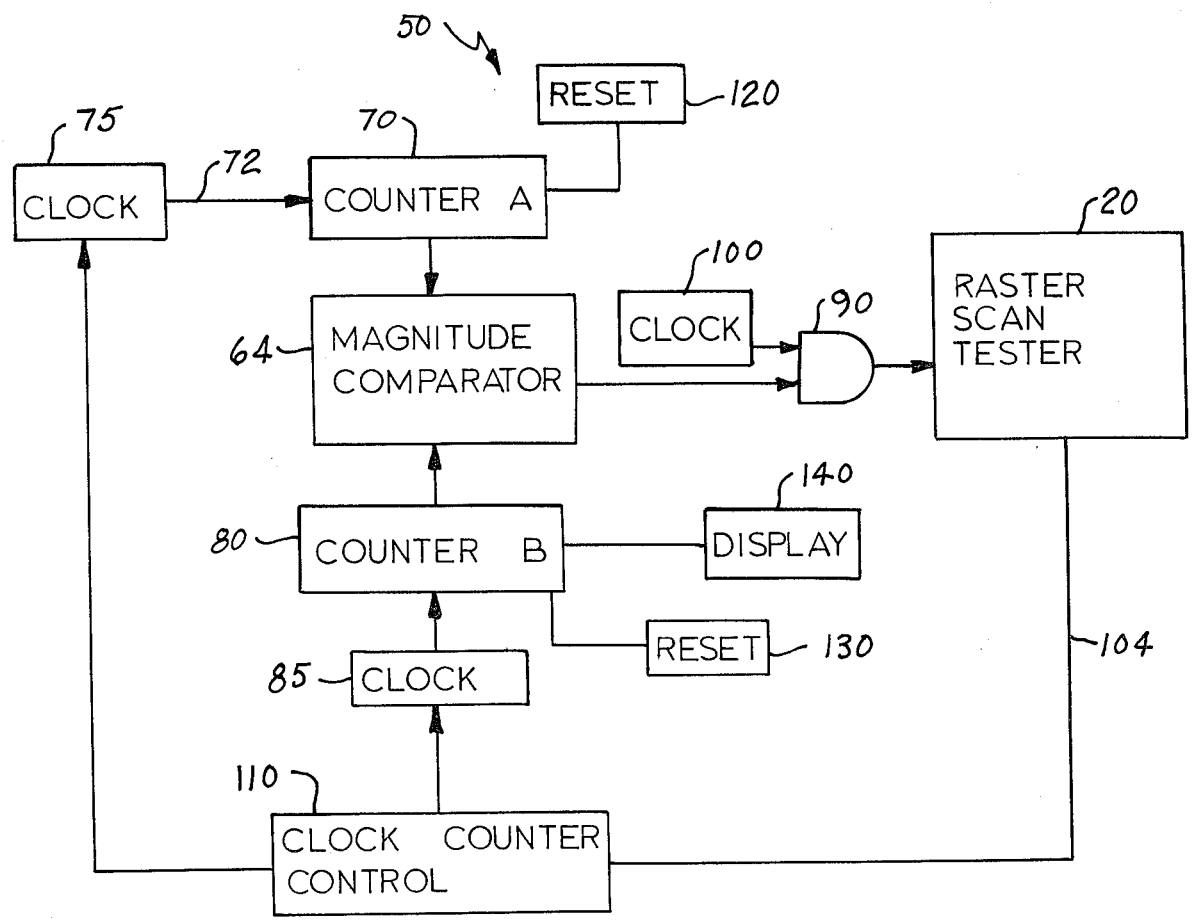
Fig. 2

METHOD OF TESTING A MEMORY BY SCANNING AT INCREASING TIME INTERVALS

BACKGROUND OF THE INVENTION

In the design, development and manufacture of digital circuitry, it becomes necessary to examine the characteristics of the devices that make up that circuitry, i.e., integrated circuits (ICs). Specifically, in the design and development of dynamic computer memory systems, high level standardization and characterization of dynamic MOS random access memories (RAMs), usually the heart of a dynamic computer memory system, must be maintained. An important characteristic of dynamic RAMs, in which the design engineer is interested, is its data retention time or maximum refresh rate. The maximum refresh rate is defined as the maximum time period between refresh cycles during which all locations in that dynamic RAM can maintain their validity. This characteristic is dependent upon a specified set of environmental conditions, and its response to these conditions must be carefully considered for the specific application. At the present time there is no convenient apparatus available for testing memories to determine maximum refresh rate. The present invention satisfies this need. The invention also provides a simple system for generating signals at progressively wider, controllable time intervals.

DESCRIPTION OF THE DRAWINGS

FIG. 1 is a schematic block diagram representation of a system embodying the invention;

FIG. 2 is a schematic block diagram representation of a portion of the system of FIG. 1.

DESCRIPTION OF THE INVENTION

Figure 3:
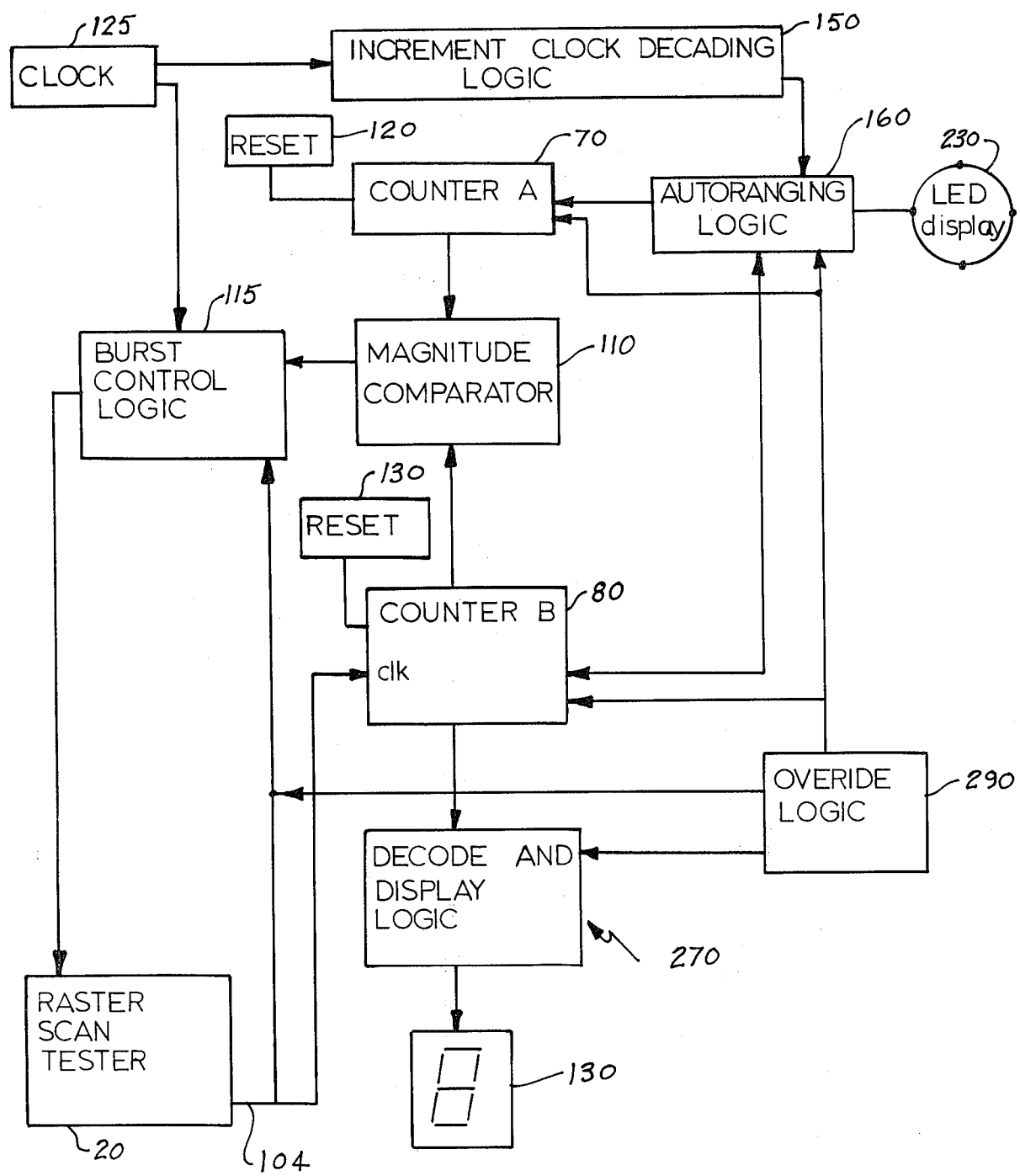
FIG. 3 is a more detailed block diagram representation of the invention.

The system and method of the invention 10 are illustrated in FIG. 1 and include a raster scan tester (RST) 20 which is adapted to scan the rows and columns of a dynamic random access memory (RAM) supported on a test head 30. Turning on of the raster scan tester to scan a memory is controlled by the apparatus of the invention 50 which is called a refresh rate analyzer (RRA) and is coupled to the raster scan tester by leads 60.

For the practice of the invention, any raster scan tester which can continuously scan or address all cells in a memory matrix with a controlled clocked input may be used for the raster scan tester 20. A preferred scanning system is described and claimed in a copending application of Lockhart, Ser. No. 075,588, filed Sept. 14, 1979, entitled LOGIC SIGNALS CONTROL SYSTEM, now U.S. Pat. No. 4,249,173 in which a system is described for scanning semiconductor memories, to sense and locate faulty cells therein. This application is incorporated herein by reference.

FIG. 2 is a more detailed block diagram of the refresh rate analyzer 50 and includes magnitude comparator 64, to which a first counter 70 and a second counter 80 are coupled. A clock 75 is coupled to the input of counter 70, and a clock 85 is coupled to the input of counter 80. The output of the comparator 64 is coupled to one input of an AND gate 90, and the second input of which is connected to a clock 100. The output of the AND gate 90 is connected to and transmits test signals from clock 100 to the raster scan tester 20. The raster scan tester has a connection 104 associated with the end of a test cycle, which is coupled to the input of a control circuit 110, the output of which is coupled to clock 85 and clock 75.

Reset circuits 120 and 130 are coupled to counters 70 and 80, respectively, and these circuits may be incorporated in a single module, if desired.

In operation of the analyzer 50, when the system is turned on, the counts in the counters 70 and 80 are the same, and a signal appears at the output of the magnitude comparator 64, and this signal is coupled to the AND gate 90 which opens and permits clock 100 to energize the raster scan tester 20 and causes it to scan through the addresses of a memory under test. If no errors appear in the memory, the raster scan tester generates an output pulse on lead 104 and thus signals that it has completed its scan to the control circuit 110. Meanwhile, counter 70 has been reset. The clock 85 is then energized, and a first count is entered in counter 80. Control circuit 110 also energizes the second clock 75, and it enters one count into counter 70. This represents the passage of a predetermined increment of time. When the count in the two counters is again the same, another signal appears at the output of the comparator 64, and the scanner 20 is again energized and scans through the memory under test. If again no error appears in the memory, counter 70 is reset, and a second greater count is entered in counter 80, and this determines a longer interval of time. The second clock 75 is then energized to enter counts in the second counter, and, when again the count in the two counters is the same, the comparator 64 provides an output which operates the raster scanner 20 to scan the memory. If now an error appears, the refresh rate of the memory has been determined, and the test procedure is terminated. The count in counter 80 can be decoded and shown in a display 140 as the refresh time for the memory under test. If an error does not appear, the test procedure is continued with longer and longer intervals of time being employed, represented by the time required for the count in the counter 70 to equal that of counter 80.

A more detailed block diagram of the invention is shown in FIG. 3, wherein some of the modules of FIG. 2 are included. In FIG. 3, a multi-decade counter 150 and logic circuit 160 are coupled between clock 125 and counter 70. Logic circuit 160 comprises a multiplexer which is used to select the desired output from decade counter 150. The output selected determines the elapsed time between the entry of a count in counter 80 and the time, or the number of clock pulses, required for counter 70 to contain the same count.

When the counter 80 reaches its maximum value (999), the multiplexer 160 selects the next lower decade of counter 150. Counter 80 is then preset with the value (100) so that the first 100 counts will not be repeated and time intervals will not be duplicated. The chosen decade is displayed in display 230 to show the range of operation of the system. Sensing of the maximum count value 999 is accomplished with the use of AND gates, and a series of one-shots preset and load counter 80 with (100). This decade counter 150 and logic circuit 160 give the system its ability to measure any range of refresh intervals from 1msec to 11.1 days for low temperature environment measurements.

The output from magnitude comparator 110, responsive to inputs from counter 70 and counter 80, is directly coupled into a burst control logic module 115. The burst control logic module 115 insures a synchronous burst of scan pulses through the entire dynamic memory, regardless of the condition of the magnitude comparator 110. When the magnitude comparator 110 signals coincidence, a JK flip-flop is set in module 115, and a scanning burst from clock 125 is transmitted to the dynamic memory under test. This burst is not disabled until a gate transition from the RST 20 is sensed at output 104, thus insuring a full burst, regardless of the state of the rest of the system.

The system shown if FIG. 3 includes a decode and display logic module 270 which makes available readable meaningful data as soon as a refresh error has been generated. The binary value from the plurality of outputs from the counter 80 is decoded directly to a plurality of seven-segment displays in display 130 with the use of BCD/7 segment decoders/drivers. The display 130 shows the elapsed time for a fault to appear in the memory under test.

The system of the invention also includes an override logic circuit 290 which is made up of AND gates and a toggle mode flip-flop and controls the mode of operation for the system. The control of this logic, via a toggle switch operated by the user, clocks the above-mentioned flip-flop in module 115, which in turn sets the proper conditions to the coupled AND gates for the two different modes of operation. One mode enables the testing process to begin on the memory (testing mode). The second, (override mode) enables constant clocking from clock 125 to raster scanner 20 and thus serves as an external pulse generator to the raster scanner 20 for other types of memory characterization testing.

In operation of the invention, the only requirement of the user is the set up of the raster scanner 20 for the desired environmental conditions for a refresh test. The previously mentioned toggle switch is toggled to the desired mode, and, if testing, the refresh rate analyzer starts its looping process, increasing a "wait to refresh" interval until a refresh error is generated on the dynamic memory under test. The maximum refresh rate equals the binary value of the counter 80 divided by the increment frequency to counter 70. Since, for this specific design, the increment frequency is conveniently divided down into decades of ten, calculation of the refresh interval is a simple task. Calculation consists of a simple multiplication of the refresh increment range, displayed by the logic 230 times the display of the decode and display logic 130.

While a refresh characterization device illustrative of the invention has been shown and described in detail, it will be readily understood by one skilled in the art that changes or variations therein may be made without departing from the scope or spirit of the invention, as defined in the following claims.

What is claimed is:

1. The method of testing electronic memories comprising the steps of writing information into all cells in a memory, after a first interval of time, scanning the memory to determine whether all cells of the memory retain their information, after a second interval of time, longer than the first interval and beginning at the end of the scan after the first interval of time, resuming scanning the memory to determine whether all cells of the memory retain their information, after a third interval of time, longer than the second interval and beginning at the end of the scan after the second interval of time, resuming scanning the memory to determine whether all cells of the memory retain their information, and continuing the scanning of the memory after longer and longer time intervals until one or more cells have lost their information.

* * * * *